(12) United States Patent
Liang et al.

(10) Patent No.: US 12,476,194 B2
(45) Date of Patent: Nov. 18, 2025

(54) SEMICONDUCTOR STRUCTURE

(71) Applicant: MediaTek Singapore Pte. Ltd., Singapore (SG)

(72) Inventors: Chang Liang, Singapore (SG); Jinghao Chen, Singapore (SG); Zhigang Duan, Singapore (SG); Kuei-Ti Chan, Hsinchu (TW)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 648 days.

(21) Appl. No.: 17/536,385

(22) Filed: Nov. 29, 2021

(65) Prior Publication Data

US 2022/0216154 A1 Jul. 7, 2022

Related U.S. Application Data

(60) Provisional application No. 63/134,235, filed on Jan. 6, 2021.

(51) Int. Cl.
*H10D 1/68* (2025.01)
*H01L 23/31* (2006.01)
(Continued)

(52) U.S. Cl.
CPC ...... *H01L 23/5383* (2013.01); *H01L 23/5386* (2013.01); *H01L 25/16* (2013.01); *H10D 1/68* (2025.01)

(58) Field of Classification Search
CPC . H01L 23/5383; H01L 23/5386; H01L 23/50; H01L 23/3128; H01L 23/481;
(Continued)

(56) References Cited

U.S. PATENT DOCUMENTS 10,217,724 B2   2/2019   Lin et al.
10,903,170 B2   1/2021   Lee et al.
(Continued)

FOREIGN PATENT DOCUMENTS

CN   1329754 A    1/2002
CN   102169842 A  8/2011
(Continued)

OTHER PUBLICATIONS

German language office action dated Mar. 23, 2024, issued in application No. DE 10 2021 131 717.7.
(Continued)

*Primary Examiner* — Omar F Mojaddedi
(74) *Attorney, Agent, or Firm* — McClure, Qualey & Rodack, LLP

(57) ABSTRACT

A semiconductor structure includes a substrate, a first semiconductor die, a second semiconductor die, and a multi-terminal capacitor structure. The substrate includes a wiring structure. The first semiconductor die and the second semiconductor die are disposed over the substrate. The multi-terminal capacitor structure is embedded in the substrate. The multi-terminal capacitor structure includes a first positive terminal and a first ground terminal which are electrically coupled to the first semiconductor die through the wiring structure. The multi-terminal capacitor structure also includes a second positive terminal and a second ground terminal which are electrically coupled to the second semiconductor die through the wiring structure.

20 Claims, 5 Drawing Sheets

(51) Int. Cl.
*H01L 23/48* (2006.01)
*H01L 23/498* (2006.01)
*H01L 23/50* (2006.01)
*H01L 23/538* (2006.01)
*H01L 25/065* (2023.01)
*H01L 25/16* (2023.01)

(58) Field of Classification Search
CPC ... H01L 23/642; H01L 25/16; H01L 25/0655; H10D 1/68
See application file for complete search history.

(56) References Cited

U.S. PATENT DOCUMENTS

| | | | |
|---|---|---|---|
| 11,996,391 B2 | 5/2024 | Duan | |
| 2007/0064375 A1 | 3/2007 | Urashima | |
| 2015/0130041 A1* | 5/2015 | Seo | H01L 23/3128 438/109 |
| 2016/0293581 A1* | 10/2016 | Lin | H01L 23/3157 |
| 2018/0012838 A1* | 1/2018 | Arvin | H01L 23/50 |
| 2018/0182700 A1 | 6/2018 | Sato | |
| 2020/0083179 A1* | 3/2020 | Lee | H01L 23/5384 |
| 2020/0286818 A1* | 9/2020 | Cho | H01L 23/49861 |
| 2020/0395335 A1* | 12/2020 | Chen | H01L 25/0652 |
| 2021/0193582 A1* | 6/2021 | Yu | H01L 23/5386 |

FOREIGN PATENT DOCUMENTS

| | | |
|---|---|---|
| CN | 106030789 A | 10/2016 |
| CN | 108111031 A | 6/2018 |
| CN | 110891368 A | 3/2020 |
| CN | 111653561 A | 9/2020 |
| DE | 10 2021 122 701 A1 | 4/2022 |
| TW | 201707164 A | 2/2017 |
| TW | 202011553 A | 3/2020 |

OTHER PUBLICATIONS

TW Office Action dated Sep. 14, 2022 in Taiwan application No. 111100325.

Lu, Y., et al.; "Trench capacitors based on semiconductor pn junction capacitance;" Electronic Components and Materials; vol. 28; No. 10; Oct. 2009; pp. 11-14 (English language abstract on p. 1 of publication).

* cited by examiner

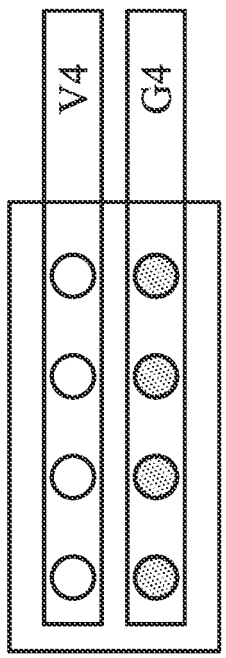
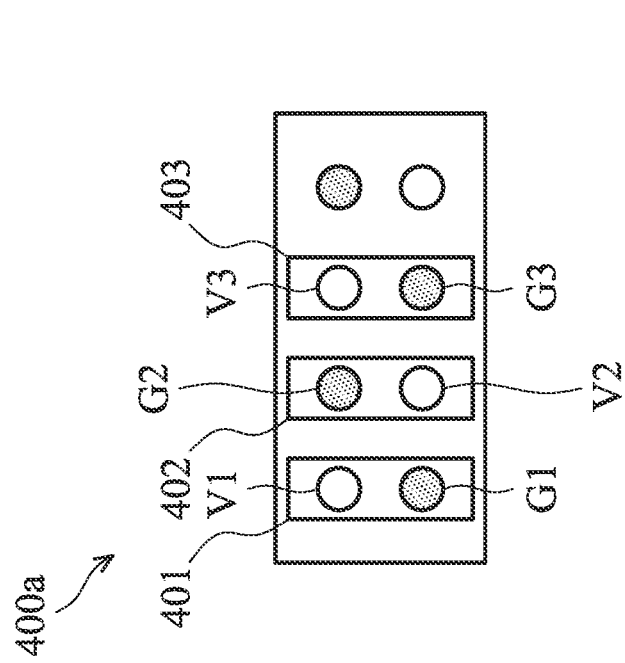
FIG. 4B
FIG. 4A

US 12,476,194 B2

SEMICONDUCTOR STRUCTURE

CROSS REFERENCE TO RELATED APPLICATIONS

This application claims the benefit of U.S. Provisional Application No. 63/134,235 filed on Jan. 6, 2021, the entirety of which is incorporated by reference herein.

BACKGROUND OF THE INVENTION

Field of the Invention

The present invention is related to semiconductor technology, and in particular to a semiconductor structure including a capacitor.

Description of the Related Art

As high performance integrated circuits demand larger currents at higher frequencies with lower power-supply voltages, power system design becomes increasingly challenging. Decoupling capacitors may be adopted to act as temporary charge reservoirs to prevent momentary fluctuations in supply voltage. The decoupling capacitors are more and more important to reduce power noise during operation of a digital circuit such as a microprocessor with numerous transistors that alternate between on and off states.

Although existing semiconductor structures are generally adequate, they are not satisfactory in every respect. For example, it is challenging to integrate decoupling capacitors since a plurality of capacitors must be used for the different power domains of different semiconductor components. For example, a central processing unit (CPU) may require one decoupling capacitor, and a high performance system-on-chip (SOC) die may require 5 to 10 decoupling capacitors. Therefore, there is a need to further improve semiconductor structures to provide design flexibility.

BRIEF SUMMARY OF THE INVENTION

Semiconductor structures are provided. An exemplary embodiment of a semiconductor structure includes a substrate, a first semiconductor die, a second semiconductor die, and a multi-terminal capacitor structure. The substrate includes a wiring structure. The first semiconductor die and the second semiconductor die are disposed over the substrate. The multi-terminal capacitor structure is embedded in the substrate. The multi-terminal capacitor structure includes a first positive terminal and a first ground terminal which are electrically coupled to the first semiconductor die through the wiring structure. The multi-terminal capacitor structure also includes a second positive terminal and a second ground terminal which are electrically coupled to the second semiconductor die through the wiring structure.

Another exemplary embodiment of a semiconductor structure includes a substrate, a package structure, and a multi-terminal capacitor structure. The package structure is disposed over the substrate and includes a first semiconductor die which has a first power domain and a second semiconductor die which has a second power domain. The first and second power domains are different. The multi-terminal capacitor structure is embedded in the substrate and includes a first multi-terminal capacitor and a second multi-terminal capacitor. The first multi-terminal capacitor includes a first positive terminal and a first ground terminal which are electrically coupled to the first power domain. The second multi-terminal capacitor includes a second positive terminal and a second ground terminal which are electrically coupled to the second power domain.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 4A and 4B are top views of a multi-terminal capacitor structure of an exemplary semiconductor structure in accordance with some embodiments;

DETAILED DESCRIPTION OF THE INVENTION

Figure 1:
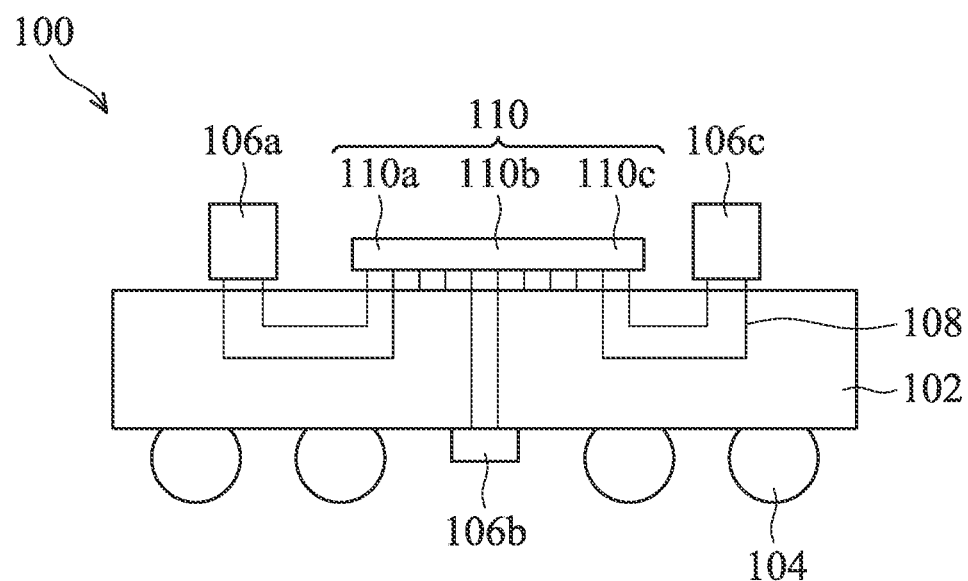
FIG. 1 is a cross-sectional view of an exemplary semiconductor structure in accordance with some embodiments.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

A semiconductor structure is described in accordance with some embodiments of the present disclosure. The semiconductor structure includes a multi-terminal capacitor structure, which has a plurality of terminals to electrically couple to different power domains, so that the occupied area can be reduced and the design flexibility can be elevated. In addition, the multi-terminal capacitor structure is embedded in a substrate so that the occupied area can be further reduced.

FIG. 1 is a cross-section view of a semiconductor structure 100 in accordance with some embodiments of the disclosure. Additional features can be added to the semiconductor structure 100. Some of the features described below can be replaced or eliminated for different embodiments. To simplify the diagram, only a portion of the semiconductor structure 100 is illustrated.

As shown in FIG. 1, the semiconductor structure 100 includes a substrate 102, in accordance with some embodiments. The substrate 102 may have a wiring structure therein. In some embodiments, the wiring structure in the substrate 102 includes conductive layers, conductive vias, conductive pillars, the like, or a combination thereof. The wiring structure in the substrate 102 may be formed of metal, such as copper, tungsten, the like, or a combination thereof.

The wiring structure in the substrate 102 may be disposed in inter-metal dielectric (IMD) layers. In some embodiments, the IMD layers are formed of organic materials, such as a polymer base material, non-organic materials, such as silicon nitride, silicon oxide, silicon oxynitride, the like, or a combination thereof. The substrate 102 may have a first surface and a second surface which is opposite to the first surface. It should be noted that the configuration of the substrate 102 shown in the figures is exemplary only and is not intended to limit the present invention. Any desired semiconductor element may be formed in and on the substrate 102. However, in order to simplify the diagram, only the flat substrate 102 is illustrated.

As shown in FIG. 1, the semiconductor structure 100 includes a plurality of conductive structures 104, in accordance with some embodiments. The conductive structures 104 may be disposed on the first surface of the substrate 102 and may be electrically coupled to the wiring structure of the substrate 102. In some embodiments, the conductive structures 104 are formed of metal, such as copper, tungsten, the like, or a combination thereof. The conductive structures 104 may be microbumps, controlled collapse chip connection (C4) bumps, ball grid array (BGA) balls, the like, or a combination thereof.

The semiconductor structure 100 includes a package structure 110, which includes a first semiconductor die 110a, a second semiconductor die 110b, and a third semiconductor die 110c, in accordance with some embodiments. The package structure 110 may be disposed on the second surface of the substrate 102. The first semiconductor die 110a, the second semiconductor die 110b, and the third semiconductor die 110c may be electrically coupled to the wiring structure of the substrate 102.

Although the first semiconductor die 110a, the second semiconductor die 110b, and the third semiconductor die 110c are disposed in one package structure as shown, the present disclosure is not limit thereto. For example, the first semiconductor die 110a, the second semiconductor die 110b, and the third semiconductor die 110c may be disposed in different package structures.

According to some embodiments, the first semiconductor die 110a, the second semiconductor die 110b, and the third semiconductor die 110c each independently includes a SoC die, a logic device, a memory device, a radio frequency (RF) device, the like, or any combination thereof. For example, the first semiconductor die 110a, the second semiconductor die 110b, and the third semiconductor die 110c may each independently include a micro control unit (MCU) die, a microprocessor unit (MPU) die, a power management integrated circuit (PMIC) die, a global positioning system (GPS) device, an accelerated processing unit (APU) die, a central processing unit (CPU) die, a graphics processing unit (GPU) die, an input-output (TO) die, a dynamic random access memory (DRAM) controller, a static random-access memory (SRAM), a high bandwidth memory (HBM), the like, or any combination thereof.

According to some other embodiments, the first semiconductor die 110a, the second semiconductor die 110b, and the third semiconductor die 110c may be different functional circuits or different cores in a die, which may use different power domains.

The first semiconductor die 110a, the second semiconductor die 110b, and the third semiconductor die 110c may have different power domains. The semiconductor structure 100 includes a first capacitor 106a, a second capacitor 106b, and a third capacitor 106c for the semiconductor dies 110a, 110b, 110c, respectively, to reduce system current-resistance (IR) drop, in accordance with some embodiments.

The semiconductor structure 100 includes a plurality of interconnects 108 which electrically couple the first capacitor 106a to the first semiconductor die 110a, electrically couple the second capacitor 106b to the second semiconductor die 110b, and electrically couple the third capacitor 106c to the third semiconductor die 110c, in accordance with some embodiments. The interconnects 108 may include bump structures, the wiring structure of the substrate 102, or other suitable interconnects.

The first capacitor 106a, the second capacitor 106b, and the third capacitor 106c each occupies spaces. As shown in FIG. 1, the first capacitor 106a and the third capacitor 106c may be disposed on the die side, and the second capacitor 106b may be disposed on the land side. The die-side capacitors (DSC) 106a and 106c may increase the thickness of the semiconductor structure 100 and may occupy area that could otherwise be used for active circuitry. The land-side capacitor (LSC) 106b may occupy area of the conductive structures 104. These are challenging to integrate different capacitors for different semiconductor components as the increasing demand for more functions and smaller devices. Consequently, the present disclosure provides another embodiment to solve the above problem.

Figure 2:
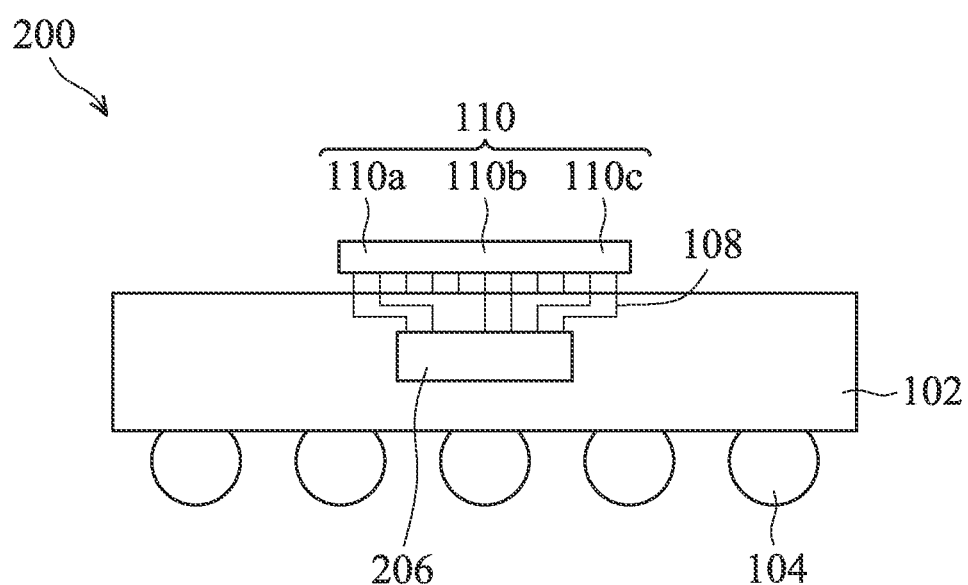
FIG. 2 is a cross-sectional view of an exemplary semiconductor structures in accordance with some embodiments.

FIG. 2 is a cross-section view of a semiconductor structure 200 in accordance with some other embodiments of the disclosure. It should be noted that the semiconductor structure 200 may include the same or similar components as that of the semiconductor structure 100, which is illustrated in FIG. 1, and for the sake of simplicity, those components will not be discussed in detail again. In comparison with the embodiment of FIG. 1 where the semiconductor structure 100 includes a plurality of capacitors which are disposed on the die side and/or on the land side, the following embodiments will replace these capacitors with a multi-terminal capacitor structure in a substrate to reduce the space occupied.

As shown in FIG. 2, the semiconductor structure 200 includes a multi-terminal capacitor structure 206, in accordance with some embodiments. The multi-terminal capacitor structure 206 may be a system-on-a-chip (SoC) capacitor, a silicon capacitor, or any suitable capacitor. The multi-terminal capacitor structure 206 may include positive terminals and ground terminals for the first semiconductor die 110a, the second semiconductor die 110b, and the third semiconductor die 110c. The semiconductor structure 200 includes a plurality of interconnects 108 which electrically couple the first semiconductor die 110a, the second semiconductor die 110b, and the third semiconductor die 110c to the multi-terminal capacitor structure 206, in accordance with some embodiments.

Different power domains for semiconductor dies can share one multi-terminal capacitor structure 206. Thus no need to use separate capacitors for each different voltage design. In addition, since the multi-terminal capacitor structure 206 is embedded in the substrate 102, occupied area and height of the semiconductor structure 200 can be reduced, and more conductive structures 104 can be remained. As a result, design flexibility can be provided.

As shown in FIG. 2, the multi-terminal capacitor structure 206 may partially overlap the package structure 110 in a direction that is substantially vertical to the first surface of the substrate 102. Although three semiconductor dies (the first semiconductor die 110a, the second semiconductor die 110b, and the third semiconductor die 110c) share one multi-terminal capacitor structure 206 is illustrated in FIG. 2, the present disclosure is not limit thereto. For example, two semiconductor dies may share the multi-terminal capacitor structure 206. Alternatively, two or more multi-terminal capacitor structures may be utilized for a plurality of semiconductor dies.

According to some embodiments, the semiconductor structure 200 also include one or more passive components (not illustrated), such as resistors, capacitors, inductors, the like, or a combination thereof. The passive components may be included in the package structure 110 and/or disposed on the first surface of the substrate 102, for example.

Figure 3:
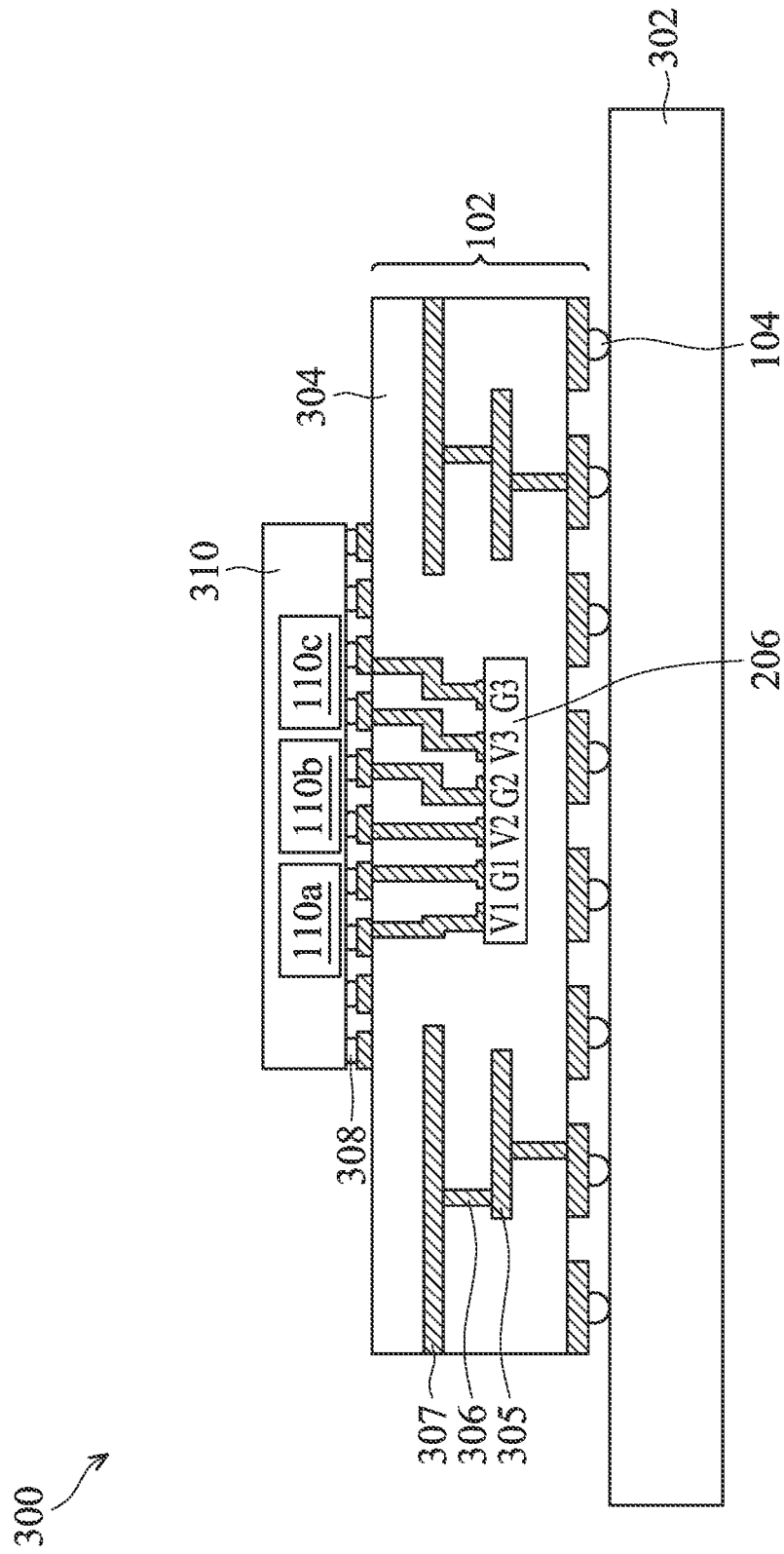
FIG. 3 is a cross-sectional view of an exemplary semiconductor structure in accordance with some embodiments.

FIG. 3 is a cross-sectional view of a semiconductor structure 300, in accordance with some embodiments of the disclosure. It should be noted that the semiconductor structure 300 may include the same or similar components as that of the semiconductor structure 200, which is illustrated in FIG. 2, and for the sake of simplicity, those components will not be discussed in detail again. In the following embodiments, a substrate with a multi-terminal capacitor structure embedded therein will be further described.

As shown in FIG. 3, the semiconductor structure 300 includes a printed circuit board (PCB) 302 and a substrate 102 disposed over the PCB 302, in accordance with some embodiments. The PCB 302 may have a wiring structure therein, which may include conductive layers, conductive vias, conductive pillars, the like, or a combination thereof. The wiring structure in the PCB 302 may be formed of metal, such as copper, tungsten, the like, or a combination thereof.

The wiring structure in the PCB 302 may be disposed in IMD layers. In some embodiments, the IMD layers are formed of organic materials, such as a polymer base material, non-organic materials, such as silicon nitride, silicon oxide, silicon oxynitride, the like, or a combination thereof. Any desired semiconductor element may be formed in and on the PCB 302. However, in order to simplify the diagram, only the flat PCB 302 is illustrated.

The wiring structure in the substrate 102 may be electrically coupled to the wiring structure in the PCB 302 through a plurality of conductive structures 104. The wiring structure in the substrate 102 may include conductive layers, conductive vias, conductive pillars, the like, or a combination thereof. In some embodiments, the wiring structure in the substrate 102 includes a first conductive layer 305 and a second conductive layer 307, and a plurality of conductive vias 306 electrically couple the conductive structures 104 to the first conductive layer 305 and electrically couple the first conductive layer 305 to the second conductive layer 307.

As shown in FIG. 3, the semiconductor structure 300 includes a multi-terminal capacitor structure 206 disposed in the substrate 102, in accordance with some embodiments. The multi-terminal capacitor structure 206 may be substantially aligned with the first conductive layer 305. The second conductive layer 307 may extend over the multi-terminal capacitor structure 206 and the first conductive layer 305. The second conductive layer 307 may be electrically coupled to the multi-terminal capacitor structure 206 through the conductive vias 306. The wiring structure in the substrate 102 may also have some conductive layers (not illustrated) extend below the multi-terminal capacitor structure 206 and the first conductive layer 305.

In some embodiments, the substrate 102 includes an insulating core (not illustrated), such as a fiberglass reinforced resin core, to prevent the substrate 102 from warpage. In the embodiments where the substrate 102 including a core, the multi-terminal capacitor structure 206 may be disposed in the core of the substrate 102. Alternatively, the multi-terminal capacitor structure 206 may be disposed over the core and be substantially aligned with one of the conductive layers.

As shown in FIG. 3, the multi-terminal capacitor structure 206 and the wiring structure in the substrate 102 are disposed in IMD layers 304, in accordance with some embodiments. In some embodiments, the IMD layers 304 are formed of organic materials, such as a polymer base material, non-organic materials, such as silicon nitride, silicon oxide, silicon oxynitride, the like, or a combination thereof.

As shown in FIG. 3, the semiconductor structure 300 includes a package structure 310 disposed over the substrate 102, in accordance with some embodiments. The package structure 310 may be similar to the package structure 110 as shown in FIG. 2, and will not be repeated. The package structure 310 may partially overlap the multi-terminal capacitor structure 206, the second conductive layer 307, and the conductive vias 306 in a direction that is substantially vertical to the first surface of the substrate 102.

As shown in FIG. 3, the semiconductor structure 300 includes a plurality of conductive structures 308 disposed between the package structure 310 and the substrate 102, in accordance with some embodiments. The conductive structures 308 may electrically couple the package structure 310 to the wiring structure of the substrate 102. In some embodiments, the conductive structures 308 are formed of metal, such as copper, tungsten, the like, or a combination thereof. The conductive structures 308 may be microbumps, controlled collapse chip connection (C4) bumps, ball grid array (BGA) balls, the like, or a combination thereof.

As shown in FIG. 3, the semiconductor structure 300 includes a first semiconductor die 110a, a second semiconductor die 110b, and a third semiconductor die 110c in the package structure 310, in accordance with some embodiments. The first semiconductor die 110a, the second semiconductor die 110b, and the third semiconductor die 110c may be similar to the first semiconductor die 110a, the second semiconductor die 110b, and/or the third semiconductor die 110c as shown in FIG. 2, and will not be repeated. According to some embodiments, the package structure 310 also include one or more passive components (not illustrated), such as resistors, capacitors, inductors, the like, or a combination thereof.

The first semiconductor die 110a, the second semiconductor die 110b, and the third semiconductor die 110c may be electrically coupled to the wiring structure of the substrate 102 through the conductive structures 308, and electrically coupled to the multi-terminal capacitor structure 206 through the wiring structure of the substrate 102 and the conductive structures 308. In particular, the first semiconductor die 110a, the second semiconductor die 110b, and the third semiconductor die 110c may be electrically coupled to the multi-terminal capacitor structure 206 through the second conductive layer 307, the conductive vias 306, and the conductive structures 308.

The multi-terminal capacitor structure 206 may include positive terminals and ground terminals for the first semiconductor die 110a, the second semiconductor die 110b, and the third semiconductor die 110c to reduce the equivalent series resistor (ESR) and equivalent series inductance (ESL) so as to reduce the system IR drop. Each of multi-terminal capacitors for the first semiconductor die 110a, the second semiconductor die 110b, and the third semiconductor die 110c may include one of the positive terminals and one of the ground terminals.

The first semiconductor die 110a may be electrically coupled to a first positive terminal V1 and a first ground terminal G1. The second semiconductor die 110b may be electrically coupled to a second positive terminal V2 and a second ground terminal G2. The third semiconductor die 110c may be electrically coupled to a third positive terminal V3 and a third ground terminal G3.

As shown in FIG. 3, the first semiconductor die 110a, the second semiconductor die 110b, and the third semiconductor die 110c are disposed in a row, which is shown for illustrative purposes only. For example, the first semiconductor die 110a, the second semiconductor die 110b, and the third semiconductor die 110c may be stacked vertically. Similarly, the first positive terminal V1, the first ground terminal G1, the second positive terminal V2, the second ground terminal G2, the third positive terminal V3, and the third ground terminal G3 disposed in a row is shown for illustrative purposes only. Some exemplary configurations are described in the following paragraphs.

FIG. 4A is a top view of a multi-terminal capacitor structure 400a in accordance with some embodiments. It should be noted that the multi-terminal capacitor structure 400a may include the same or similar components as that of the multi-terminal capacitor structure 206, which is illustrated in FIG. 3, and for the sake of simplicity, those components will not be discussed in detail again.

In some embodiments, the first multi-terminal capacitor 401 includes a first positive terminal V1 and a first ground terminal G1, the second multi-terminal capacitor 402 includes a second positive terminal V2 and a second ground terminal G2, and the third multi-terminal capacitor 403 includes a third positive terminal V3 and a third ground terminal G3. The multi-terminal capacitor structure 206 also include some other terminals which are shown for illustrative purpose only. Two adjacent multi-terminal capacitors 401, 402, 403 and their terminals may be arranged side-by-side.

As shown in FIG. 4A, the first positive terminal V1, the second ground terminal G2, and the third positive terminal V3 may be disposed along a first line, and the first ground terminal G1, the second positive terminal V2, and the third ground terminal G3 may be disposed along a second line. The first line may be substantially parallel to the second line.

Figure 5B:
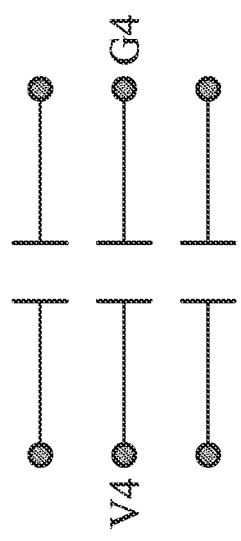
FIGS. 5A, 5B, and 5C are conceptual diagrams of terminals of a multi-terminal capacitor structure of an exemplary semiconductor structure in accordance with some embodiments.
Figure 5A:
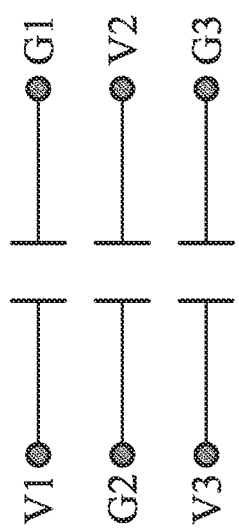

A conceptual diagram of six of the multi-terminal capacitor structure 400a is illustrated in FIG. 5A, in accordance with some embodiments. The first positive terminal V1, the second positive terminal V2, and the third positive terminal V3 may be electrically isolated from each other. The first ground terminal G1, the second ground terminal G2, and the third ground terminal G3 may be electrically isolated from each other. In particular, the first multi-terminal capacitor, the second multi-terminal capacitor, and the third multi-terminal capacitor may be electrically isolated from each other.

FIG. 4B is a top view of a multi-terminal capacitor structure 400b in accordance with some embodiments. It should be noted that the multi-terminal capacitor structure 400b may include the same or similar components as that of the multi-terminal capacitor structure 400a, which is illustrated in FIG. 4B, and for the sake of simplicity, those components will not be discussed in detail again.

In some embodiments, a first positive terminal, a second positive terminal, a third positive terminal, and a fourth positive terminal are equal, which may be referred to as V4.

In some embodiments, a first ground terminal, a second ground terminal, a third ground terminal, and a fourth ground terminal are equal, which may be referred to as G4. Two adjacent multi-terminal capacitors and their terminals may be arranged side-by-side.

As shown in FIG. 4B, the first positive terminal, the second positive terminal, the third positive terminal, and the fourth positive terminal V4 may be disposed along a first line, and the first ground terminal, the second ground terminal, the third ground terminal, and the fourth ground terminal G4 may be disposed along a second line. The first line may be substantially parallel to the second line.

A conceptual diagram of six of the terminals of the multi-terminal capacitor structure 400b is illustrated in FIG. 5B, in accordance with some embodiments. The first positive terminal, the second positive terminal, and the third positive terminal V4 may be electrically coupled to each other. The first ground terminal, the second ground terminal, and the third ground terminal G4 may be electrically coupled to each other. That is, the first multi-terminal capacitor, the second multi-terminal capacitor, and the third multi-terminal capacitor may be electrically coupled to each other.

Figure 5C:
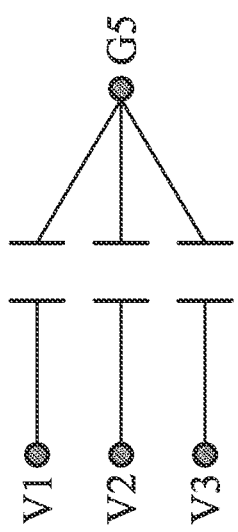

FIG. 5C is a conceptual diagram of a multi-terminal capacitor structure in accordance with some embodiments. In some embodiments, the first multi-terminal capacitor includes a first positive terminal V1 and a first ground terminal, the second multi-terminal capacitor includes a second positive terminal V2 and a second ground terminal, and the third multi-terminal capacitor includes a third positive terminal V3 and a third ground terminal. The first ground terminal, the second ground terminal, and the third ground terminal may be electrically coupled to a common ground G5.

Figure 6:
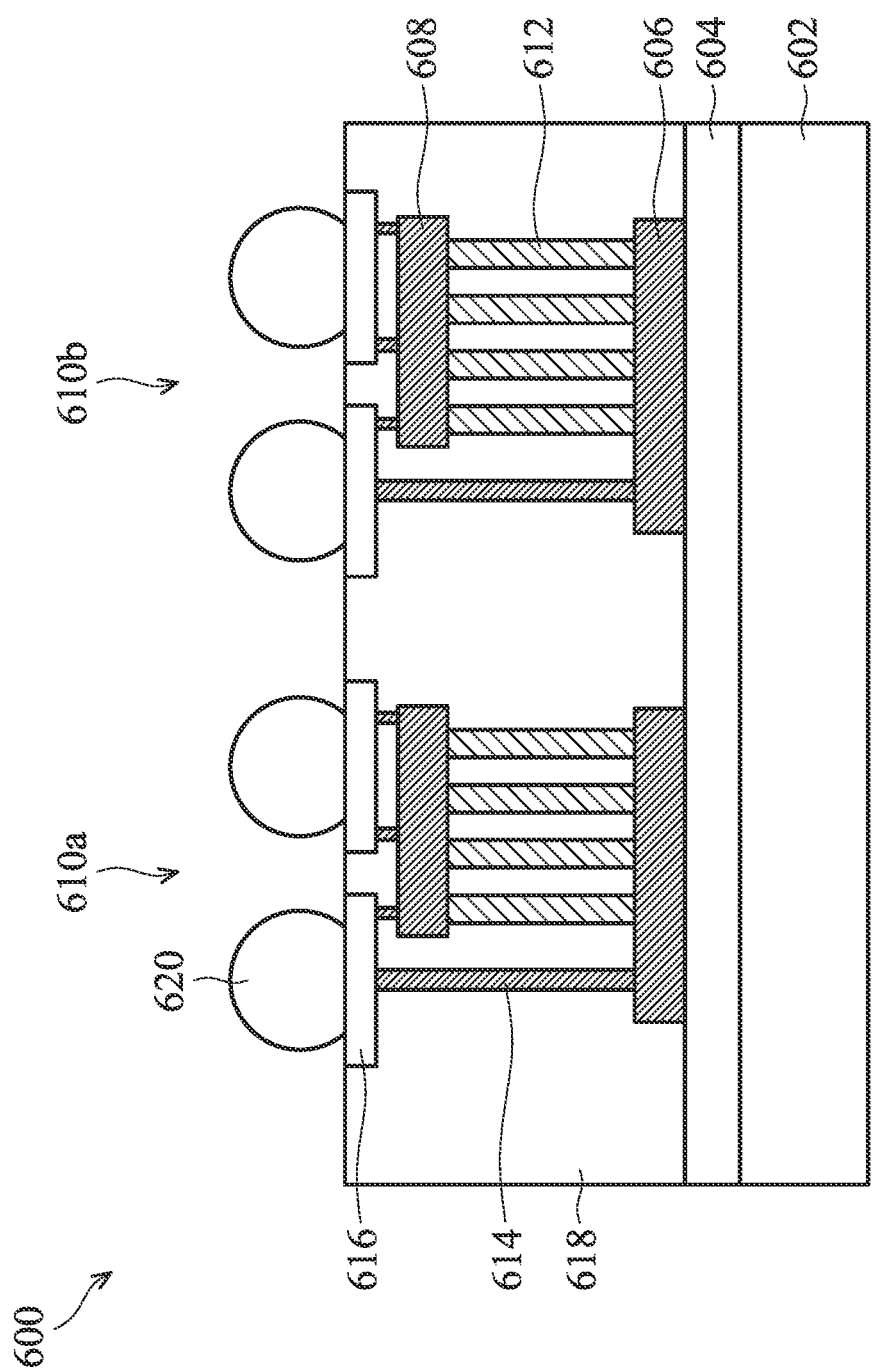
FIG. 6 is a cross-sectional view of a multi-terminal capacitor structure of an exemplary semiconductor structure in accordance with some embodiments.

FIG. 6 is a cross-sectional view of a multi-terminal capacitor structure 600 of a semiconductor structure in accordance with some embodiments. It should be noted that the multi-terminal capacitor structure 600 may include the same or similar components as that of the multi-terminal capacitor structure 206, which is illustrated in FIG. 2, and for the sake of simplicity, those components will not be discussed in detail again.

As shown in FIG. 6, the multi-terminal capacitor structure 600 includes a semiconductor substrate 602, in accordance with some embodiments. The semiconductor substrate 602 may be formed of silicon, silicon germanium, germanium, other suitable semiconductor, or a combination thereof. It should be noted that the configuration of the semiconductor substrate 602 shown in the figures is exemplary only and is not intended to limit the present invention. Any desired semiconductor element may be formed in and on the semiconductor substrate 602. However, in order to simplify the diagram, only the flat semiconductor substrate 602 is illustrated.

As shown in FIG. 6, the multi-terminal capacitor structure 600 includes an insulating layer 604 disposed over the semiconductor substrate 602, in accordance with some embodiments. The insulating layer 604 may cover the top surface of the semiconductor substrate 602. The insulating layer 604 may be formed of silicon oxide, silicon nitride, silicon oxynitride, other suitable isolation material, or a combination thereof.

As shown in FIG. 6, the multi-terminal capacitor structure 600 includes a first multi-terminal capacitor 610a and a second multi-terminal capacitor 610b disposed over the insulating layer 604. The insulating layer 604 may electrically isolate the first multi-terminal capacitor 610a and the second multi-terminal capacitor 610b from the substrate 102. As a result, a plurality of multi-terminal capacitors can be grouped to form one capacitor (i.e., the multi-terminal capacitor structure 600) to provide decoupling capacitor function for different power domains. Therefore, occupied area can be reduced and cost can be saved. Additionally, design flexibility can be improved, and performance boost can also be provided.

As shown in FIG. 6, each of the first multi-terminal capacitor 610a and the second multi-terminal capacitor 610b includes conductive layers 606, 608, 616, in accordance with some embodiments. The conductive layers 606, 608, 616 may be formed of metal, such as copper, tungsten, the like, or a combination thereof. Each of the first multi-terminal capacitor 610a and the second multi-terminal capacitor 610b includes capacitor cells 612 between the conductive layers 606 and 608, and includes a plurality of conductive vias 614 between the conductive layers 606 and 616 and between the conductive layers 608 and 616, in accordance with some embodiments. The conductive vias 614 may be formed of metal, such as copper, tungsten, the like, or a combination thereof.

As shown in FIG. 6, the multi-terminal capacitor structure 600 includes a dielectric layer 618 disposed over the insulating layer 604 and surrounds the first multi-terminal capacitor 610a and the second multi-terminal capacitor 610b, in accordance with some embodiments. The first multi-terminal capacitor 610a and the second multi-terminal capacitor 610b may be spaced apart by the dielectric layer 618. The dielectric layer 618 may be formed of organic materials, such as a polymer base material, non-organic materials, such as silicon nitride, silicon oxide, silicon oxynitride, the like, or a combination thereof.

As shown in FIG. 6, each of the first multi-terminal capacitor 610a and the second multi-terminal capacitor 610b includes terminals 620 disposed over the conductive layers 616 and electrically coupled to the conductive layers 616, in accordance with some embodiments. The terminals 620 may be exposed by the dielectric layer 618. The terminals 620 may be formed of metal, such as copper, tungsten, the like, or a combination thereof.

The terminals 620 of the first multi-terminal capacitor 610a may include a positive terminal and a ground terminal and may electrically couple the capacitor cell 612 to a semiconductor die (such as the first semiconductor die 110a as shown in FIG. 2). The terminals 620 of the second multi-terminal capacitor 610b may include a positive terminal and a ground terminal and may electrically couple the capacitor cell 612 to another semiconductor die (such as the second semiconductor die 110b as shown in FIG. 2).

In summary, the present disclosure adopts a multi-terminal capacitor structure in a substrate. The multi-terminal capacitor structure may include positive terminals and ground terminals for different power domains of different semiconductor dies. In comparison with using separate capacitors which are disposed on the die side and/or on the land side, the area and the thickness occupied by the capacitors can be reduced according to the present disclosure. As a result, design flexibility can be increased, and design can be easier. Performance boost can also be achieved. Moreover, the equivalent series resistor (ESR) and equivalent series inductance (ESL) can be reduced, thereby lowering the system IR drop.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a substrate comprising a wiring structure;
   a first semiconductor die and a second semiconductor disposed over the substrate; and
   a multi-terminal capacitor structure embedded in the substrate and comprising:
   a first positive terminal and a first ground terminal electrically coupled to the first semiconductor die through the wiring structure; and
   a second positive terminal and a second ground terminal electrically coupled to the second semiconductor die through the wiring structure,
   wherein a bottom surface of the first positive terminal, a bottom surface of the second positive terminal, a bottom surface of the first ground terminal and a bottom surface of the second ground terminal are at the same level.

2. The semiconductor structure as claimed in claim 1, wherein the multi-terminal capacitor structure comprises:
   a first multi-terminal capacitor comprising the first positive terminal and the first ground terminal; and
   a second multi-terminal capacitor comprising the second positive terminal and the second ground terminal.

3. The semiconductor structure as claimed in claim 2, wherein the multi-terminal capacitor structure further comprises:
   a semiconductor substrate; and
   an insulating layer disposed over the semiconductor substrate, wherein the first multi-terminal capacitor and the second multi-terminal capacitor are disposed over the insulating layer and are electrically isolated from the semiconductor substrate.

4. The semiconductor structure as claimed in claim 1, wherein the wiring structure comprises a first conductive layer and a plurality of conductive vias, and wherein the multi-terminal capacitor structure is substantially aligned with the first conductive layer and is electrically coupled to the first semiconductor die and/or the second semiconductor die through the plurality of conductive vias.

5. The semiconductor structure as claimed in claim 4, wherein the wiring structure further comprises a second conductive layer disposed over the multi-terminal capacitor structure and electrically coupling the multi-terminal capacitor structure to the first semiconductor die and/or the second semiconductor die.

6. The semiconductor structure as claimed in claim 1, wherein the first positive terminal and the second positive terminal are disposed along a first line, and the first ground terminal and the second ground terminal are disposed along a second line, wherein the first line is substantially parallel to the second line.

7. The semiconductor structure as claimed in claim 1, wherein the first positive terminal and the second ground terminal are disposed along a first line, and the first ground terminal and the second positive terminal are disposed along a second line, wherein the first line is substantially parallel to the second line.

8. The semiconductor structure as claimed in claim 1, wherein the first ground terminal and the second ground terminal are electrically coupled to a common ground.

9. The semiconductor structure as claimed in claim 1, wherein the first ground terminal is electrically coupled to the second ground terminal.

10. The semiconductor structure as claimed in claim 9, wherein the first positive terminal is electrically coupled to the second positive terminal.

11. A semiconductor structure, comprising:
a substrate;
a package structure disposed over the substrate and comprising a first semiconductor die having a first power domain and a second semiconductor die having a second power domain that is different from the first power domain; and
a multi-terminal capacitor structure embedded in the substrate and comprising:
a first multi-terminal capacitor comprising a first positive terminal and a first ground terminal which are electrically coupled to the first power domain; and
a second multi-terminal capacitor comprising a second positive terminal and a second ground terminal which are electrically coupled to the second power domain,
wherein a bottom surface of the first positive terminal, a bottom surface of the second positive terminal, a bottom surface of the first ground terminal and a bottom surface of the second ground terminal are at the same level.

12. The semiconductor structure as claimed in claim 11, wherein the substrate comprises:
a conductive layer substantially aligned with the multi-terminal capacitor structure; and
a plurality of conductive vias electrically coupling the first multi-terminal capacitor and the second multi-terminal capacitor to the first semiconductor die and the second semiconductor die, respectively.

13. The semiconductor structure as claimed in claim 11, wherein the multi-terminal capacitor structure further comprises:
a semiconductor substrate; and
an insulating layer disposed over the semiconductor substrate, wherein the first multi-terminal capacitor and the second multi-terminal capacitor are disposed over the insulating layer and are electrically isolated from the semiconductor substrate.

14. The semiconductor structure as claimed in claim 13, wherein the multi-terminal capacitor structure further comprises a third multi-terminal capacitor comprising a third positive terminal and a third ground terminal,
wherein the first multi-terminal capacitor, the second multi-terminal capacitor, and the third multi-terminal capacitor are electrically isolated from each other.

15. The semiconductor structure as claimed in claim 14, wherein the first positive terminal, the second positive terminal, and the third positive terminal are disposed along a first line, and the first ground terminal, the second ground terminal, and the third ground terminal are disposed along a second line.

16. The semiconductor structure as claimed in claim 14, wherein the first positive terminal, the second ground terminal, and the third positive terminal are disposed along a first line, and the first ground terminal, the second positive terminal, and the third ground terminal are disposed along a second line.

17. The semiconductor structure as claimed in claim 11, further comprising a printed circuit board disposed below the substrate and electrically coupled to the substrate.

18. The semiconductor structure as claimed in claim 17, further comprising a plurality of conductive structures disposed between the package structure and the substrate and disposed between the substrate and the printed circuit board.

19. The semiconductor structure as claimed in claim 11, wherein the multi-terminal capacitor structure further comprises capacitor cells electrically coupled to the first positive terminal and the first ground terminal, wherein the capacitor cells are located under the bottom surface of the first positive terminal and the bottom surface of the first ground terminal.

20. The semiconductor structure as claimed in claim 19, wherein the multi-terminal capacitor structure further comprises a first conductive layer and a second conductive layer, wherein the capacitor cells are located vertically between the first conductive layer and the second conductive layer, and the first positive terminal vertically overlaps both the first conductive layer and the second conductive layer.

* * * * *